United States Patent [19]

Nose et al.

[11] Patent Number: 5,585,923

[45] Date of Patent: Dec. 17, 1996

[54] METHOD AND APPARATUS FOR MEASURING POSITIONAL DEVIATION WHILE CORRECTING AN ERROR ON THE BASIS OF THE ERROR DETECTION BY AN ERROR DETECTING MEANS

[75] Inventors: Noriyuki Nose, Atsugi; Takeshi Miyachi, Zama; Kenji Saitoh, Atsugi; Koichi Sentoku, Samukawamachi; Takahiro Matsumoto, Atsugi, all of Japan

[73] Assignee: Canon Kabushiki Kaisha, Tokyo, Japan

[21] Appl. No.: 314,444

[22] Filed: Sep. 28, 1994

Related U.S. Application Data

[63] Continuation of Ser. No. 151,887, Nov. 15, 1993, abandoned.

[30] Foreign Application Priority Data

Nov. 14, 1992 [JP] Japan .................................. 4-328675
Sep. 27, 1993 [JP] Japan .................................. 4-264248

[51] Int. Cl.⁶ .................................................. G01B 9/02
[52] U.S. Cl. ...................... 356/363; 356/349; 356/401; 356/356; 250/548
[58] Field of Search .................................. 356/356, 349, 356/363, 400, 401, 359, 360; 250/548

[56] References Cited

U.S. PATENT DOCUMENTS

| 4,710,026 | 12/1987 | Magome et al. . | |
| 4,804,270 | 2/1989 | Miller et al. | 356/363 |
| 5,000,573 | 3/1991 | Suzuki et al. | 356/363 |
| 5,114,236 | 5/1992 | Matsugu et al. . | |
| 5,142,156 | 8/1992 | Ozawa et al. | 356/401 |
| 5,182,610 | 1/1993 | Shibata | 356/363 |
| 5,182,615 | 1/1993 | Korosawa et al. | 356/401 |
| 5,196,711 | 3/1993 | Matsuga et al. . | |
| 5,200,800 | 4/1993 | Suda et al. . | |
| 5,235,408 | 8/1993 | Matsugu et al. | 356/401 |
| 5,243,195 | 9/1993 | Nishi | 356/401 |
| 5,285,259 | 2/1994 | Saitoh . | |
| 5,333,050 | 7/1994 | Nose et al. . | |
| 5,347,356 | 9/1994 | Ota et al. | 356/356 |

FOREIGN PATENT DOCUMENTS 5-203411  8/1993  Japan .

*Primary Examiner*—Frank Gonzalez
*Assistant Examiner*—Robert Kim
*Attorney, Agent, or Firm*—Fitzpatrick, Cella, Harper & Scinto

[57] ABSTRACT

A method and apparatus for measuring the relative positional deviation between first and second diffraction gratings formed on an object includes determining the relative positional deviation of the first and second diffraction gratings while detecting and correcting an error produced in relation to detection of the positional deviation of the first and second diffraction gratings.

7 Claims, 11 Drawing Sheets

(A)  (B)

METHOD AND APPARATUS FOR MEASURING POSITIONAL DEVIATION WHILE CORRECTING AN ERROR ON THE BASIS OF THE ERROR DETECTION BY AN ERROR DETECTING MEANS

This application is a continuation of application Ser. No. 08/151,887 filed Nov. 15, 1993, now abandoned.

FIELD OF THE INVENTION AND RELATED ART

This invention relates to a positional deviation measuring method and apparatus usable, for example, in an alignment system in a semiconductor device manufacturing exposure apparatus or in measurement of precision of semiconductor device pattern registration.

For measurement of the deviation between two diffraction gratings to be examined, there is a known method wherein coherent light is projected to grating patterns of the diffraction gratings so that interference light is produced from light diffracted by the grating patterns. On the basis of the phase difference between beat signals obtainable from interference light including the produced interference light, the phase difference between the two diffraction gratings is measured.

However, among the relationships between the patterns and the input light projected to the patterns, there is a problem in relation to a change in the phase difference $\Delta\phi$ and amount of rotation along the surface of a wafer on which these patterns are formed. This will be explained with reference to FIGS. 1 and 2. FIGS. 1 and 2 schematically illustrate the impingement of light upon patterns being examined. The distance between the centers of the diffraction grating patterns 1 and 2 is denoted by d. The center of the pattern 1 is at P1, and the center of the pattern 2 is at P2. To the patterns 1 and 2, light L1 (angular frequency w1) is projected obliquely from the right side as viewed in the drawing. Also, light L2 (angular frequency w2) is projected to these patterns similarly from the right side in the drawing. Diffraction light emerging from the same grating are caused to interfere with each other, such that two beat signals are produced.

Illustrated is a case where the angle of incidence of the light upon the patterns 1 and 1 deviates by $\theta z$ in the Z direction, from the direction of grating array, as seen in FIG. 1. Here, the point of intersection of a normal extending from the point P1 to the light L2 impinging on the point P2 is denoted by H and, if the light L2 is consists of a plane wave, a line segment HP1 is included by an equiphase plane. Also, if a light ray of the light L2 impinging on the point P1 is denoted by L3 and a light ray of the light L2 impinging on the point P2 is denoted by L4 and if the direction cosine of the direction of advancement of the light rays L3 and L4 is denoted by $(\alpha, \beta, \gamma)$, then the length of a line segment HP2 is expressed as follows:

$$HP2 = \beta \cdot d \qquad (1)$$

Further, if a light ray of the light L1 impinging on the point P1 is denoted by L5 and a light ray impinging on the point P2 is denoted by L6, the complex amplitude indication of first order diffraction light of the light ray L3 is as follows:

$$Ea'(f1) = A \cdot \exp\{i(w1 \cdot t + \phi 1 + \phi a)\} \qquad (2)$$

Similarly, the complex amplitude indication of diffraction light of the light rays L5, L4 and L6 is, according to equations (2), (3) and (4), as follows:

$$Ea'(f2) = B \cdot \exp\{i(w2 \cdot t + \phi 2 - \phi a)\} \qquad (3)$$

$$Eb'(f1) = A \cdot \exp[i\{w1 \cdot t + \phi 1 + \phi b + (2\pi/\lambda)\beta \cdot d\}] \qquad (4)$$

$$Eb'(f2) = B \cdot \exp[i(w2 \cdot t + \phi 2 - \phi b + (2\pi/\lambda)\beta \cdot d\}] \qquad (5)$$

Due to interference between Ea'(f1) and Ea'(f2), the resultant beat signal is as follows:

$$\begin{aligned} Ia' &= |Ea'(f1) + Ea'(f2)|^2 \qquad (6) \\ &= A^2 + B^2 + 2A \cdot B \cos\{(w1 - w2)t + (\phi 1 - \phi 2) + 2\phi a\} \end{aligned}$$

Similarly, due to interference between Eb'(f1) and Eb'(f2), the resultant beat signal is such as follows:

$$Ib' = A^2 + B^2 + 2A \cdot B \cos\{(w1-w2)t + (\phi 1 - \phi 2) + 2\phi b - 2(2\pi/\lambda)\beta \cdot d\} \qquad (7)$$

Thus, from equations (6) and (7), if $\theta z \neq 0$, as compared with a case where $\theta z = 0$ and therefore $\beta = 0$, the phase changes by $(4\pi/\lambda)\beta \cdot d$. From this, if an error contained in the measured value of deviation between the diffraction gratings 5 and 6 is $\Delta x'$, it is expressed as follows:

$$\Delta x' = 2\beta \cdot d \qquad (8)$$

Thus, the value corresponding to $\Delta x' = 5$ nm, if $d = 100$ microns, is as follows:

$$\begin{aligned} \beta &= \Delta x'/2d \\ &= 5 \text{ nm}/\{2 \times 100(\mu m)\} \\ &= 2.5 \times 10^{-5} \end{aligned}$$

If $\theta z = 90(\text{deg}) - \cos^{-1}\beta = 5.1$, namely, if the value $\theta z$ changes by 5.1", the detected value of the deviation between the grating patterns 5 and 6 shifts by 5 nm.

This means that, if there is a relative shift of 5.1" between the detection optical system and the wafer, corresponding to rotation along the wafer surface, a shift error of 5 nm results. This causes a large problem in the case where the deviation has to be detected very precisely. Generally, where a wafer stage feeds a wafer of 6 inches or 8 inches, a movement of a long stroke of the order of 200 nm is necessary. To prevent rotation of a second order, a complicated monitor mechanism and complicated control operations are required. If the stage feeding is executed by using a simple mechanism, rotation of a second order (i.e., yawing) results. This causes a corresponding pattern deviation detection error. For a stage of 200 nm stroke, usually a yawing of the order of 10" to 20" is produced, which results in a measurement error of 10 nm to 20 nm. It is therefore not possible to attain a precision of 5 nm or higher, corresponding to the printing precision evaluation of a 25-micron line-and-space pattern (256 MDRAM). The yawing may be reduced by controlling the stage very precisely. However, this makes the system very complicated and expensive.

While the problem has been described with reference to FIGS. 1 and 2 in relation to the measurement of the deviation between patterns provided on one and the same object, this problem applies also to the measurement of the deviation between patterns provided on two objects.

SUMMARY OF THE INVENTION

It is accordingly an object of the present invention to provide a method and/or an apparatus for measuring a positional deviation, by which, if a relative shift is produced between an optically detecting system and an object to be examined, along the surface of the object, the error resulting from the shift is canceled such that the deviation can be measured with a very high precision of the order of a nanometer.

In accordance with an aspect of the present invention, to achieve the above object, there is provided a device for measuring a relative positional deviation between first and second diffraction gratings formed on an object, the device comprising: signal detecting means for detecting a signal corresponding to the relative positional deviation between the first and second objects. The signal detecting means includes (i) irradiating means for projecting first and second coherent lights onto the first and second diffraction gratings, (ii) first photoelectric converting means for photoelectrically converting first interference light resulting from interference between first and second diffraction lights both caused by diffraction of the first coherent light and the second coherent light by the first diffraction grating, (iii) second photoelectric converting means for photoelectrically converting second interference light resulting from interference between third and fourth diffraction lights both caused by diffraction of the first and second coherent lights by the second diffraction grating, and (iv) signal producing means for producing a signal corresponding to the relative positional deviation on the basis of output signals from the first and second photoelectric converting means, respectively. The device also comprises moving means for relatively moving the object and at least a portion of the signal detecting means with each other; and error detecting means cooperable with the moving means to place third and fourth diffraction gratings of the object at a detecting position of the signal detecting means so that the signal detecting means produces a signal corresponding to a relative positional deviation between the third and fourth diffraction gratings. The relative positional deviation between the third and fourth diffraction gratings is predetermined. The error detecting means detects an error in detection of the relative positional deviation by the signal detecting means on the basis of the signal produced by the signal detecting means in response to the detection of the predetermined relative positional deviation between the third and fourth diffraction gratings. The device also comprises measuring means cooperable with the moving means to place the first and second diffraction gratings at the detecting position of the signal detecting means so that the signal detecting means produces a signal corresponding to the relative positional deviation between the first and second diffraction gratings. The measuring means determines the relative positional deviation of the first and second diffraction gratings while correcting an error on the basis of the error detection by the error detecting means.

In a preferred form of the invention, the first and second coherent light beams of the signal detecting means have different wavelengths.

In another preferred form, the signal producing means includes means for producing a signal corresponding to the phase difference between the output signals of the first and second photoelectric converting means.

In a further preferred form, the deviation measuring device further comprises change detecting means for detecting a change in amount of relative rotation of the object relative to the signal detecting means during the relative movement of the object and the at least a portion of the signal detecting means, wherein, in determination of the relative positional deviation, the measuring means corrects the error while adding the detected change in the amount of relative rotation to the error.

In a still further preferred form, the moving means comprises a movable stage on which the object is placed, and wherein the change detecting means comprises yawing detecting means for detecting the yaw of the stage.

In a yet further preferred form, the change detecting means comprises projecting means for projecting light to a diffraction grating of the object, light directing means for directing ± n-th order light diffracted by the diffraction grating to a predetermined detection plane, and position detecting means for detecting a position of incidence of the ± n-th order light upon the detection plane.

In a yet further preferred form, the change detecting means comprises light projecting means for projecting light to a diffraction grating of the object, and image projecting means for projecting an image of the diffraction grating upon a predetermined detection plane.

In accordance with another aspect of the present invention, there is provided a method of measuring the relative positional deviation between first and second diffraction gratings formed on an object. The method comprises the steps of: detecting, through a signal detecting system, a signal corresponding to the relative positional deviation between the first and second objects. The signal detecting system includes (i) an optical system for projecting first and second coherent lights onto the first and second diffraction gratings, (ii) a first photoelectric converting device for photoelectrically converting first interference light resulting from interference between first and second diffraction lights both caused by diffraction of the first coherent light and the second coherent light by the first diffraction grating, (iii) a second photoelectric converting device for photoelectrically converting second interference light resulting from interference between third and fourth diffraction lights both caused by diffraction of the first and second coherent lights by the second diffraction grating, and (iv) a signal producing unit for producing a signal corresponding to the relative positional deviation on the basis of output signals from the first and second photoelectric converting devices, respectively. The method further comprises the step of detecting an error in the detection of the relative positional deviation by the signal detecting system. For the error detection, third and fourth diffraction gratings of the object are placed at a detecting position of the signal detecting system so that the signal detecting system produces a signal corresponding to a relative positional deviation between the third and fourth diffraction gratings. The relative positional deviation between the third and fourth diffraction gratings is predetermined. The error in detection of the relative positional deviation by the signal detecting system is detected on the basis of the signal produced by the signal detecting system in response to the detection of the predetermined relative positional deviation between the third and fourth diffraction gratings the method further comprises the step of measuring the relative positional deviation of the first and second diffraction gratings. For the measurement, the first and second diffraction gratings are placed at the detecting position of the signal detecting system so that the signal detecting system produces a signal corresponding to the relative positional deviation between the first and second diffraction gratings. The relative positional deviation of the first and second diffraction gratings is determined while correcting an error on the basis of the error detection.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

An embodiment of the present invention will be explained with reference to FIGS. 3–14.

Figure 1:
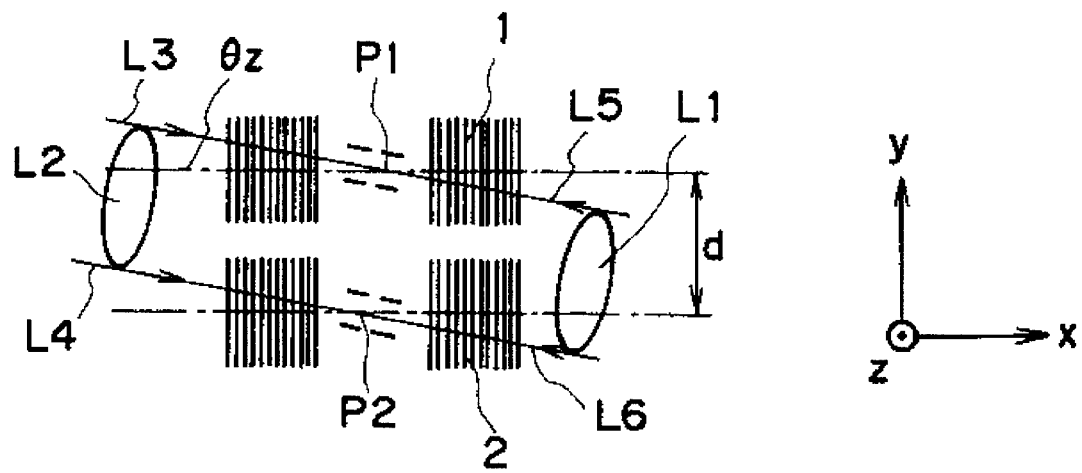
FIG. 1 is a schematic view for explaining the relation between a yawing and an error resulting therefrom.
Figure 2:
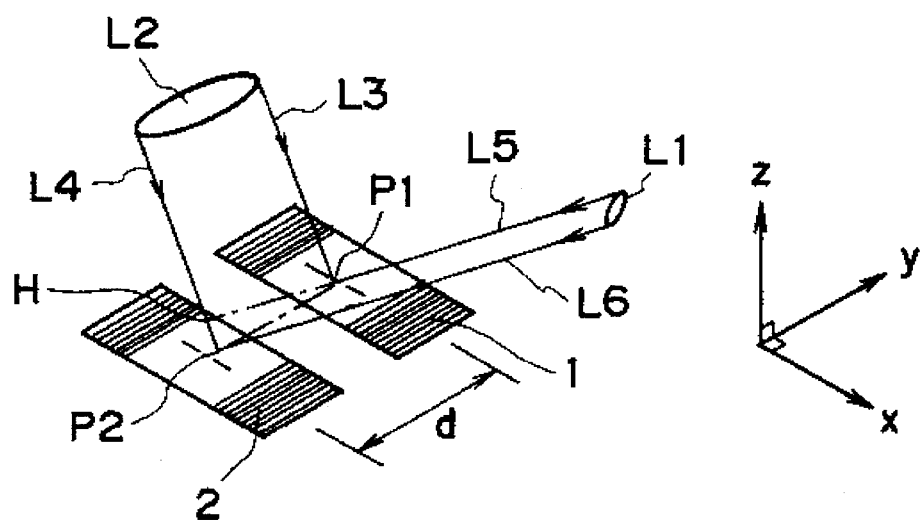
FIG. 2 is similar to FIG. 1 and schematically illustrates the relation between a yawing and the error resulting therefrom.
Figure 3:
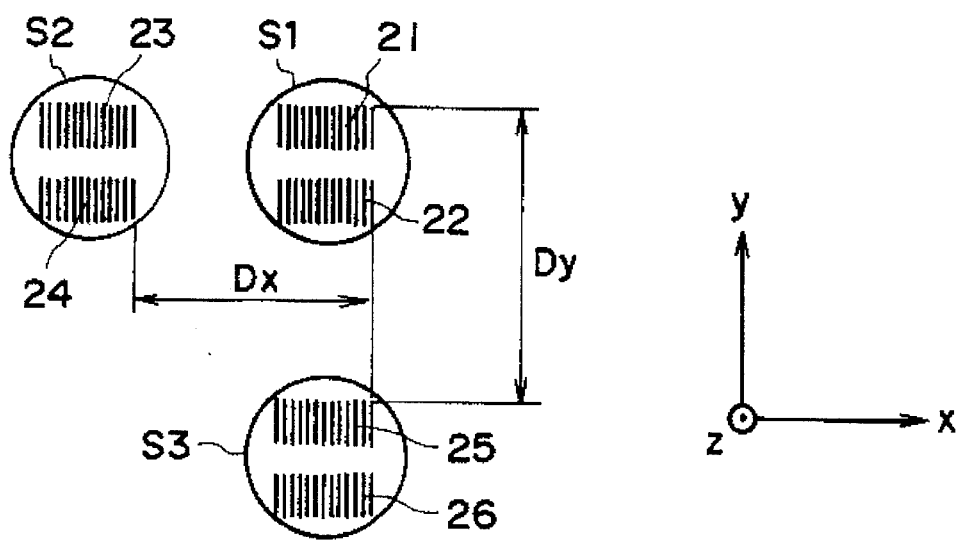
FIG. 3 is a schematic view of a deviation of patterns on an object.
Figure 4:
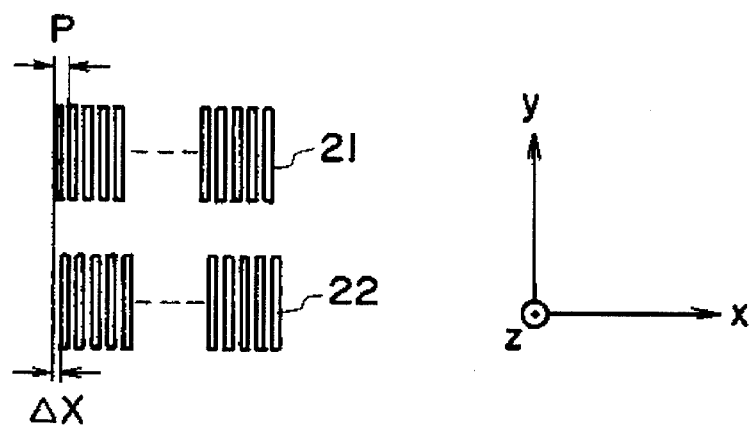
FIG. 4 illustrates the details of a grating portion.
Figure 5:
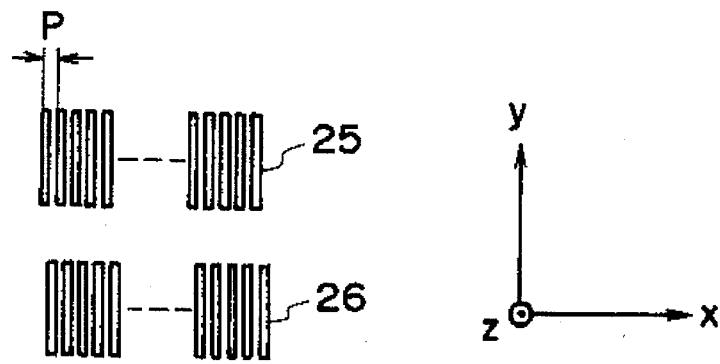
FIG. 5 is similar to FIG. 4 and illustrates the details of a grating portion.

FIG. 3 is a schematic view of the first embodiment, wherein denoted at 21 and 22 are diffraction gratings which are formed on a wafer and the relative deviation of patterns which is to be detected. Disposed at positions spaced by Dx in the −X direction from the diffraction gratings 21 and 22 are diffraction gratings 23 and 24 which are provided by printing, for example, and which are to be evaluated similarly. The diffraction gratings 21 and 22 may correspond to (N)th and (N+1)th printing patterns of a reticle or mask for the manufacture of semiconductor devices. An enlarged view of this is illustrated in FIG. 4. Similarly, the diffraction gratings 23 and 24 may correspond to (M)-th and (M+1)th printing patterns of the reticle or mask, wherein M may be equal to N. Also, disposed at positions spaced by Dy in −Y direction from the diffraction gratings 21 and 22 are reference diffraction gratings 25 and 26 as shown in FIG. 5, which may be provided by a mask or reticle formed through electron beam pattern drawing so that they have no mutual deviation.

Denoted at ΔX is a pattern printing misregistration (deviation) of the diffraction gratings 21 and 22, as printed on a wafer. Here, the diffraction grating has a pitch P. In FIG. 3, reference characters S1, S2 and S3 denote light spots formed by light projected from an optical detection system and impinging on a pair of the diffraction gratings 21 and 22, a pair of the diffraction gratings 23 and 24 and a pair of the reference diffraction gratings 25 and 26.

Thus, when the optical detection system to be described (FIG. 7) and a wafer to be examined are moved relatively and if a stage on which the wafer is placed is moved by −Dx in the X direction, for example, from the position at which the light spot is projected on the diffraction gratings 21 and 22, then the light is projected on the diffraction gratings 23 and 24. To move to the position of the spot S3, the stage may be moved in the Y direction by −Dy.

Figure 6:
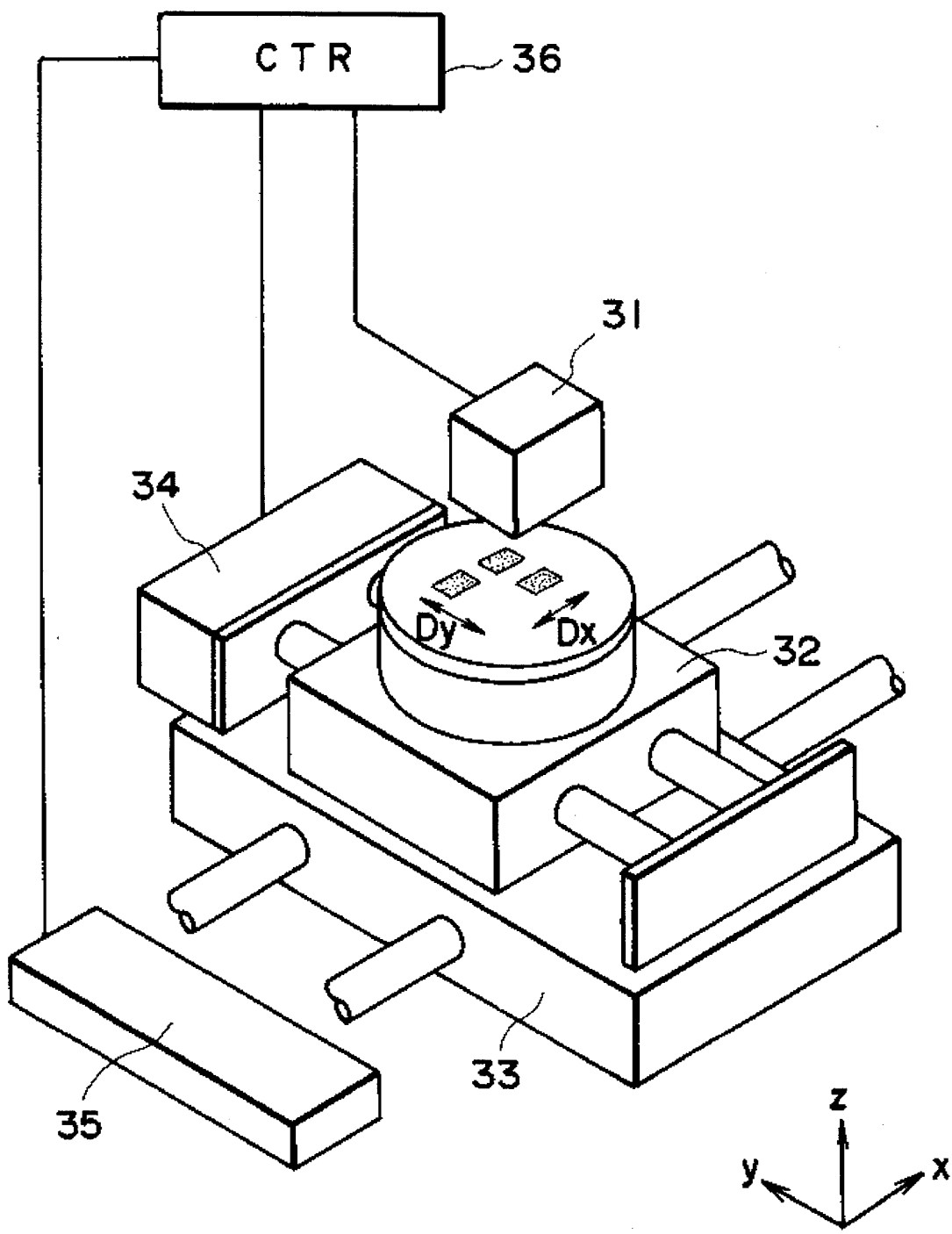
FIG. 6 is a schematic view of an arrangement according to a first embodiment of the present invention.

FIG. 6 is a perspective view for explaining a case where, for measurement, a wafer to be examined is placed on the stage. Diffraction gratings 21–26 are formed on the wafer, and an optical detection system 31 is provided above the wafer. The wafer is placed on a Y-axis stage 32 and an X-axis stage 33. The Y-axis stage 32 is coupled to a Y-axis stage driving mechanism 34, and the x-stage 33 is coupled to an X-axis stage driving mechanism 35. The optical detection system 31, the Y-axis stage driving mechanism 34 and the x-axis stage driving mechanism 35 are electrically connected with each other so that they are controlled by a control means 36.

Figure 7:
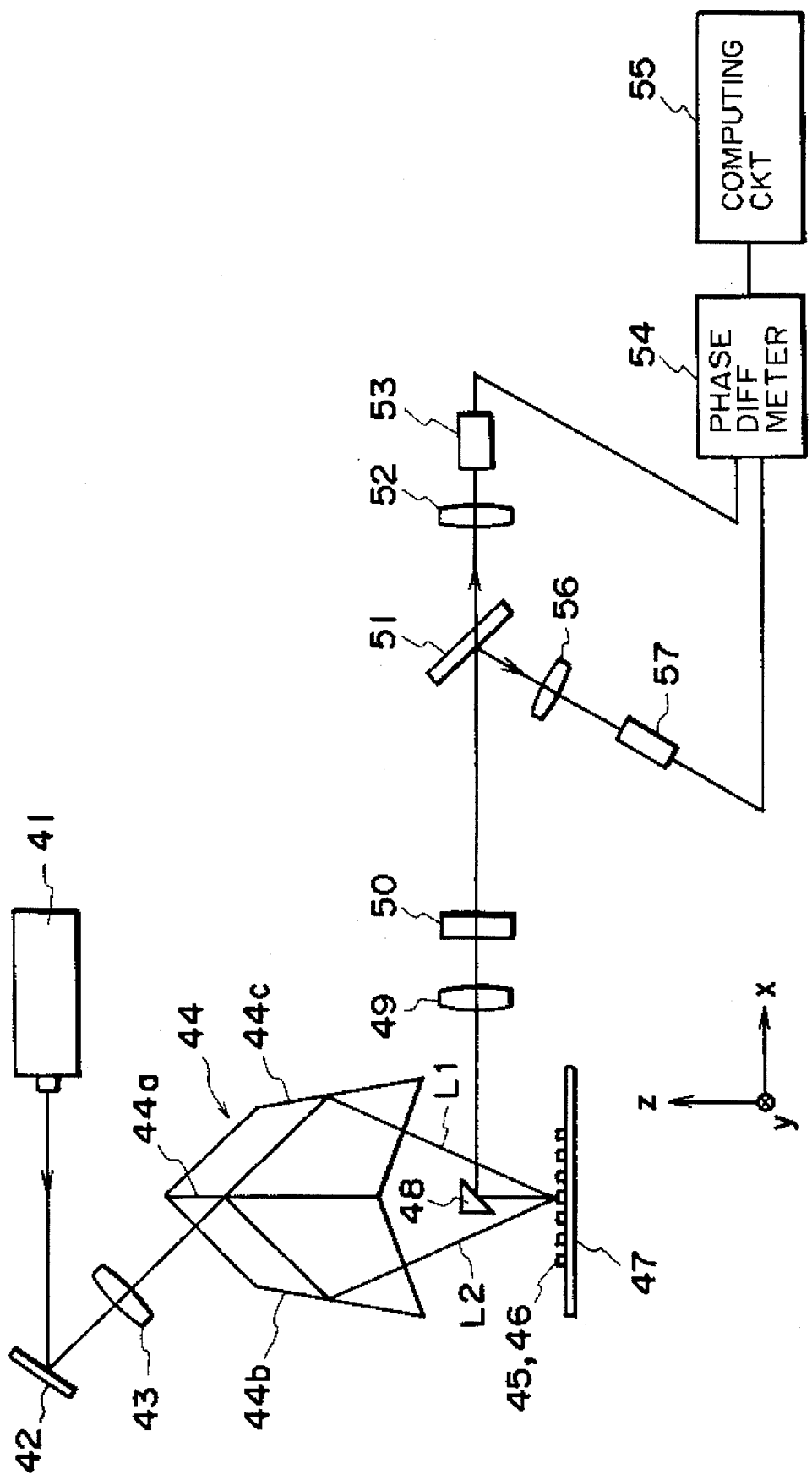
FIG. 7 is a schematic view of an optical detection system.
Figure 8:
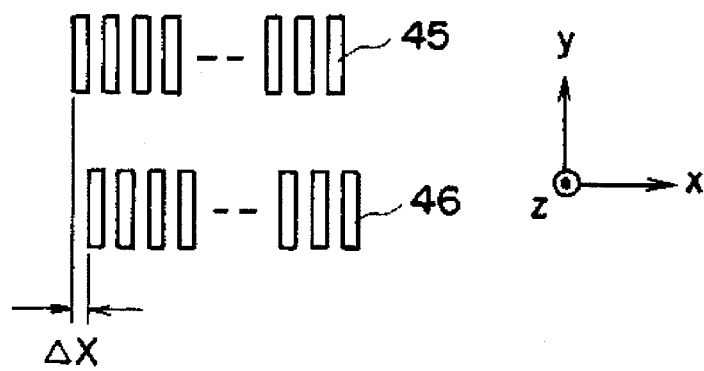
FIG. 8 is an enlarged view of a grating pattern.
Figure 9:
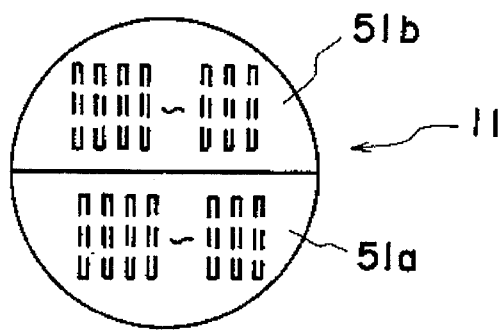
FIG. 9 is a schematic view for illustrating the relation between an edge mirror and a grating pattern.

FIG. 7 shows details of the optical detection system 31. Dual-frequency linear polarization laser light source 41 has an optical path along which a mirror 42 is disposed. Along the direction of reflection of the mirror 42, a collimator lens 43 and a prism 44 are disposed in this order. In the direction of light emission from the prism 44, a wafer 47 is placed. Here, for explanation of the principle, the used wafer is the one as having diffraction gratings 45 and 46 such as shown in FIG. 8. In the direction of reflection of the wafer 47, a mirror 48 is provided. Along the direction of reflection of the mirror 48, a lens 49, a Glan-Thompson prism 50, an edge mirror 51 having a glass portion 51a and a mirror portion 51b (FIG. 9), another lens 52 and a photodetector 53 are disposed in this order. Output of the photodetector 53 is connected to a computer 55 through a phase difference measuring circuit 54. Also, disposed along the direction of reflection of the edge mirror 51 are a lens 56 and a photodetector 57. Output of the photodetector 57 is connected to the phase difference measuring circuit 54.

Figure 10:
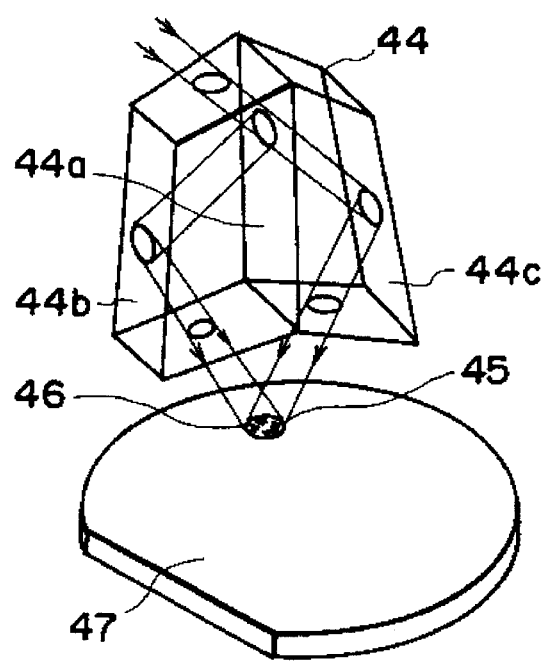
FIG. 10 is a schematic view for illustrating the relation between a prism and a light impinging on a wafer.
Figure 11:
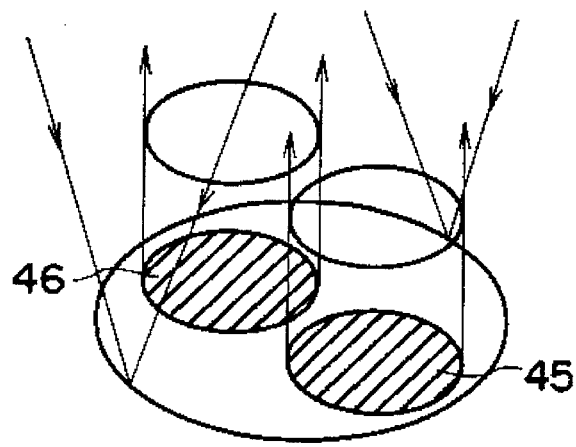
FIG. 11 is a schematic view for illustrating the state of light impingement on a wafer and the diffraction of light thereby.

S-polarized light of a frequency f1 and P-polarized light of another frequency f2, produced by the dual-frequency linear polarization laser light source 41, are deflected by the mirror 42 and, after passing the collimator lens 43, they enter the prism 44. As seen in FIG. 10, the light of S-polarization and of frequency f1 is reflected by a polarization beam splitter portion 44a of the prism 44, while the light of P-polarization and of frequency f2 passes through that portion. These lights are then reflected by reflecting portions 44b and 44c, respectively. After this, these lights go out of the prism 44 and are projected on the diffraction gratings 45 and 46 of the wafer 47, whereby diffraction light is produced.

The diffraction gratings 45 and 46 of the wafer 47 comprises two regular-pitch straight diffraction gratings adjacent to each other, which are formed on the wafer 47 through respective printing processes, respectively. They have the same pitch p. As seen in FIG. 6, there is a positional deviation ΔX in the X direction between the diffraction gratings 45 and 46, produced during the printing operation. Here, complex amplitude indications of first order diffraction light Ea(f1) of the left-hand side input light of frequency f1 produced by the diffraction grating 45 and negative first order diffraction light Ea(f2) of the right-hand side input light of frequency f2, are such as follows:

$$Ea(f1)=A\cdot exp\{i(w1\cdot t+\phi 1+\phi a)\} \quad (9)$$

$$Ea(f2)=B\cdot exp\{i(w2\cdot t+\phi 2-\phi a)\} \quad (10)$$

wherein A and B are amplitudes, w1 and w2 are angular frequencies, and φ1 and φ2 are initial phases of lights emerging from the dual-frequency linear polarization laser light source 41, and wherein φa=2πXa/p. Also, Xa denotes the amount of deviation in the X direction of the diffraction grating 45 from a reference position on the wafer 47.

Similarly, complex amplitude indications of first order diffraction light Eb(f1) of the left-hand side input light of frequency f1 and negative first order diffraction light Eb(f2) of the right-hand side input light of frequency f2, produced by the diffraction grating 56, are such as follows:

$$Eb(f1)=A\cdot exp\{i(w1\cdot t+\phi 1+\phi b)\} \quad (11)$$

$$Eb(f2)=B\cdot exp\{i(w2\cdot t+\phi 2-\phi b)\} \quad (12)$$

wherein φb=2πXb/p and wherein Xb represents the amount of deviation in X direction of the diffraction grating 56 from its reference position.

Lights diffracted by the diffraction gratings 45 and 46 are deflected by the mirror 48 and then they pass through the lens 49 and the Glan-Thompson prism 50. By means of the Glan-Thompson prism 50, the planes of polarization of the diffraction lights are registered with each other so that these lights now interfere with each other. Intensity changes Ia and Ib of these interference lights (Ea(f1) and Ea(f2); Eb(f1) and Eb(f2)), namely, beat signals, are expressed as follows:

$$Ia=A^2+B^2+2A\cdot B\cos\{(w1-w2)t+(\phi 1-\phi 2)+2\phi a\} \quad (13)$$

$$Ib=A^2+B^2+2A\cdot B\cos\{(w1-w2)t+(\phi 1-\phi 2)+2\phi b\} \quad (14)$$

The two diffraction interference lights may be separated in the following manner: That is, the wafer 47 and the edge mirror 51 are disposed in an optically conjugate relation with each other, and the two diffraction interference lights are spatially and minutely spaced from each other. Thus, by using the edge mirror 51, the boundary L (FIG. 10) between the glass portion 51a and the mirror portion 51b may be disposed at the middle between the diffraction lights from the two diffraction gratings 45 and 46, such that the diffraction light from the diffraction grating 45 is reflected by the edge mirror 51 and is directed through the lens 56 to the photodetector 57 while the diffraction light from the other diffraction grating 46 passes through the edge mirror 51 and is directed through the lens 52 to the photodetector 53.

Beat signals detected by the photodetectors 57 and 53 are applied to the phase difference measuring circuit 54, by which a phase difference between them is detected. If the phase difference is denoted by Δφ, it is expressed as follows:

$$\Delta\phi = (\phi a - \phi b) \quad (15)$$
$$= 4\pi(Xa - Xb)/p$$

It follows that the relative deviation ΔX in X direction between the diffraction gratings 45 and 46 is given by the following equation:

$$\Delta X = Xa - Xb \quad (16)$$
$$= \Delta\phi\cdot p/4\pi$$

From this, it is seen that the relative deviation between the diffraction gratings 45 and 46 can be determined by applying the output Δφ of the phase difference measuring circuit 54 to the computer 55 and by executing therein the calculation according to equation (16). By detecting the deviation between a grating pattern (such as the diffraction grating 45) having been printed through the first-time printing operation and another grating pattern (such as the diffraction grating 46) having been printed through the second-time printing operation, in the manner described above, it becomes possible to determine the alignment precision of a semiconductor exposure apparatus, namely, the misalignment (misregistration) of actual device patterns formed through the first and second printing operations.

As illustrated in FIGS. 3 and 6, the reference diffraction gratings 25 and 26 having no mutual deviation as predetermined are provided in the neighbourhood of the diffraction gratings 21 and 22 as and the diffraction gratings 23 and 24. By referring, in each deviation measurement, to the measured value of the reference diffraction gratings 25 and 26 as "zero", if the distances Dx and Dy are sufficiently smaller than 200 nm, measurement of high precision as desired is assured.

More specifically, measurement may be made first to the reference diffraction gratings 25 and 26 by using the optical detection system 31, and a measured value may be obtained. The measured value will normally be "zero". If the measured value is not equal to zero, it may be considered as resulting from an error component due to yawing (and a system error of the detection system as a whole which may result from an aberration of the detection optical system or an electrical error of the phase difference measuring circuit). Then, the measure value may be stored in the computer 55 as a reference value. Thereafter, the stage may be moved through a small distance of an order by which a substantial stage movement error is not caused, so as to move and place the diffraction gratings 25 and 26 to and at the measuring position, in substitution for the reference diffraction gratings. Then, by using the photodetector 31, measurement may be made to these diffraction gratings. Since the same detection system is used, the measured value obtained with this measurement will contain an error component resulting from yawing (and a system error of the detection system as a whole) and corresponding to that produced during the measurement to the reference diffraction gratings. Thus, the memorized reference value may be subtracted from the measured value, and the resultant value is stored in the computer 55 as a "correct measurement value". By doing so, it is possible to obtain a measurement value of high accuracy while removing the effect of yawing (and the system error).

If, for example, the distances Dx and Dy are of an order of 20 nm or less, there may be yawing of 10"–20" through a stroke of 200 nm. Even if a stage which produces an error of 10–20 nm through its full stroke is used, only a small error results from yawing of 1"–2" order. The error resulting therefrom, that is, the measurement error resulting from the stage movement from the reference diffraction grating to the diffraction grating being examined, is very small such as of an order of 1–2 nm. Thus, the measured value of the reference diffraction grating may well be used as a reference value for the measurement of the diffraction grating to be examined.

A desired number of paired grating patterns such as above may be formed and distributed on the whole of a wafer, each pair being printed simultaneously by using one mask (reticle) having its deviation predetermined. Such reference gratings may be formed while those gratings to be examined are printed and distributed on the whole of the wafer. During the process of sequentially measuring the gratings of patterns to be examined, with the step-and-repeat operation, a reference grating disposed between adjacent gratings to be examined may be measured to obtain a reference value to be used for the measurement of the subsequent grating. By doing so, it is possible to suppress the error resulting from the yawing component in the measurement of a pattern, being examined, which is within the range of 10–20 nm of the corresponding reference pattern.

Figure 12:
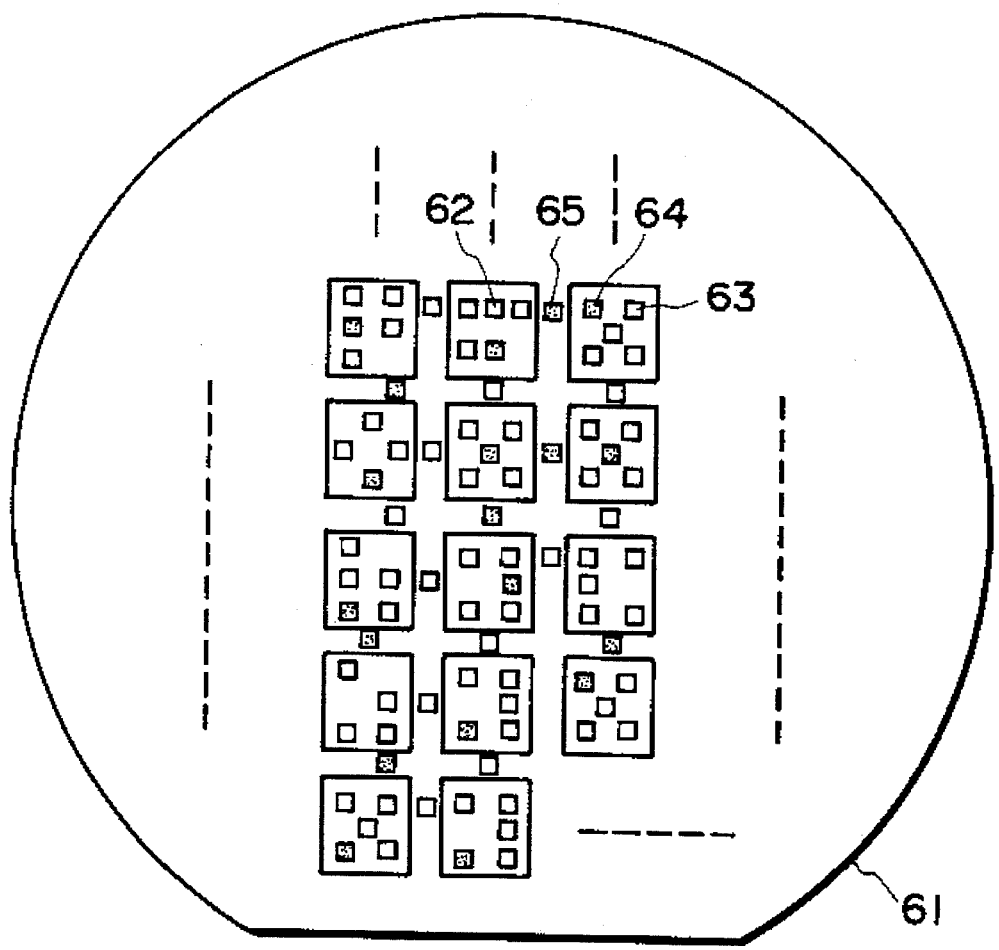
FIG. 12 is a plan view, schematically illustrating an example of a pattern layout on a wafer.

FIG. 12 illustrates a pattern array according to this example. Wafer 61 has a plurality of one-shot areas 62 formed thereon. Diffraction grating 63 to be examined as well as reference grating 64 are formed within each one-shot area 62, being printed thereon by using (N)-th reticle and an (M)-th reticle (normally, M=N+1). Also, a reference grating 65 is formed on a scribe line. With the provision of a reference pattern between adjacent patterns to be examined, it is possible to enhance the precision.

While FIGS. 3 and 4 illustrate a case related to a deviation in the X-axis direction, a deviation with respect to two axial directions, X and Y, may be measured similarly by providing the measuring arrangement with respect to both of the X and Y axes.

Figure 13:
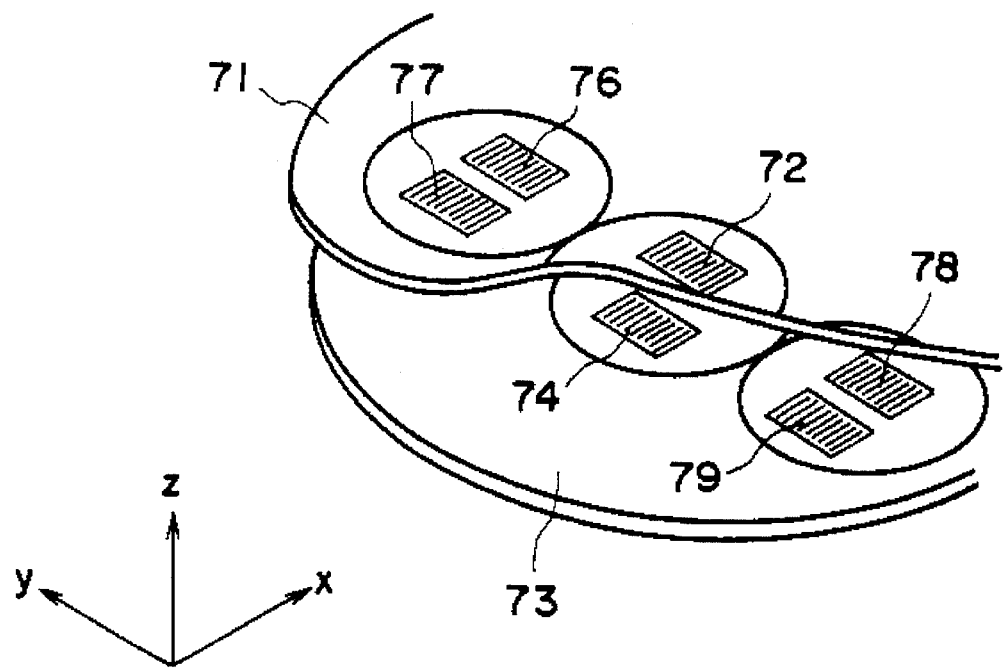
FIG. 13 is a schematic view for explaining the deviation of patterns formed on two objects.
Figure 14:
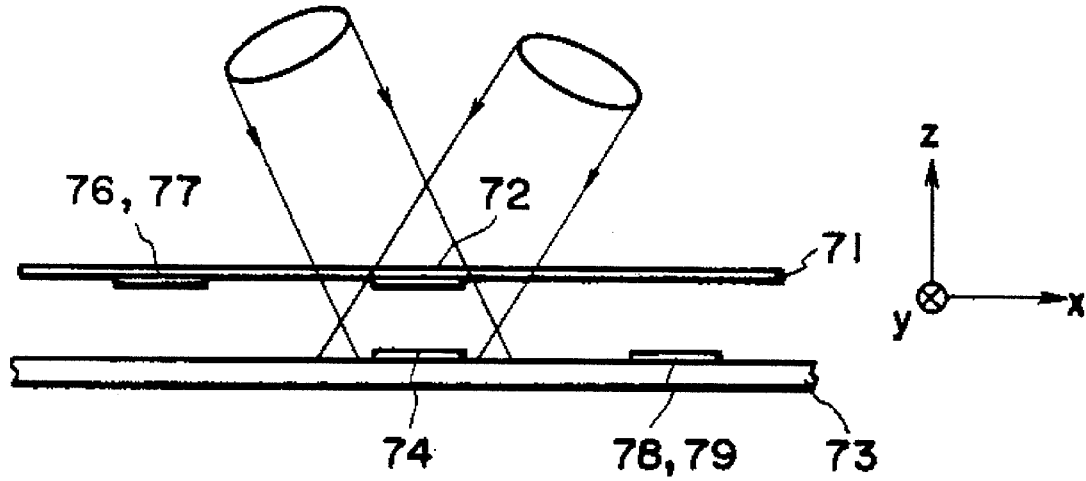
FIG. 14 is a schematic view for explaining the measurement of a deviation of patterns on two objects.

FIGS. 13 and 14 show a second embodiment, and they illustrate the relation of diffraction grating patterns and beams, for measurement of the deviation between patterns formed on two objects such as a mask and a wafer. Illustrated is a case where the deviation in the X-axis direction is to be detected. Mask 71 has formed thereon a diffraction grating 72 to be examined, and a wafer 73 has formed thereon a diffraction grating 74 to be examined. These diffraction gratings provide diffraction grating patterns for detection of a positional deviation between the mask and the wafer. Diffraction light and a used detection system are not illustrated. The arrangement such as is shown in FIGS. 3 and 7 may be used as an optical detection system 31 for detecting light diffracted by the diffraction gratings 72 and 74.

In FIG. 13, reference diffraction gratings 76 and 77 are formed on the mask 71. These diffraction gratings have been printed on by using one and the same mask and have zero mutual deviation as has been predetermined. Also, reference diffraction gratings 78 and 79 are formed on the wafer 73, and similarly they have no mutual deviation as has been predetermined. The reference diffraction gratings 76–79 are relatively close to the patterns of the diffraction gratings 72 and 74, and they are formed at a distance in a range of 10–20 nm, for example. To displace the position of impingement of light from the diffraction gratings 72 and 74 to the patterns of the reference diffraction gratings 76 and 77 or to the patterns of the reference diffraction gratings 78 and 79, the optical detection system 31 such as described hereinbefore may be moved. Since only the position of light impingement is to be changed, only a portion of the optical detection system may be moved.

It is seen from the above that the present invention is similarly applicable to measurement of the deviation between patterns provided on two objects. Further, the reference pattern may be formed with a deviation not equal to zero. Provided that it is formed with a particular deviation which is predetermined, the object of the present invention can be achieved similarly. Thus, with the present invention, it is possible to assure evaluation of printing precision, for a semiconductor such as a DRAM (Dynamic Random Access Memory) for which 0.25–0.1 a micron pattern rule is required, with a desired precision of 5 nm or higher.

Figure 15:
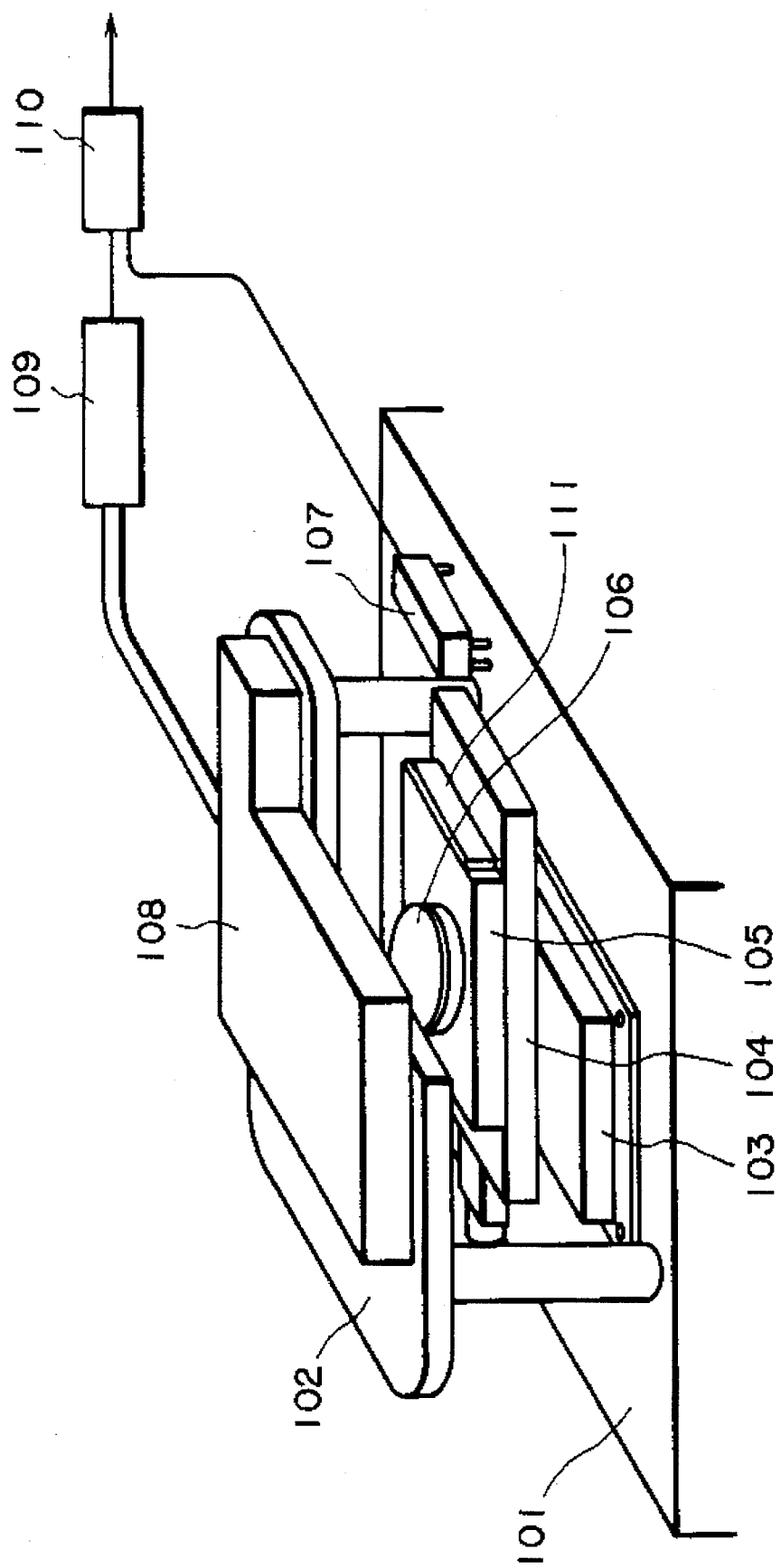
FIG. 15 is a schematic view of the positional deviation measuring device according to a second embodiment of the present invention.

FIG. 15 is a schematic view of a second embodiment of the present invention.

As shown in FIG. 15, disposed on a base 101 are an X stage 103, a Y stage 104 and a θ stage 105. A wafer 106 is placed on the θ stage 105.

Also mounted on the base 101 is a second base 102 which is supported by pillars. Detection optical system 108 of a positional deviation measuring device is disposed on the second base 102. The detection optical system 108 may have the same structure as that of the detection optical system shown in FIG. 7. The wafer 106 has formed thereon pairs of diffraction gratings, each pair including two adjacent diffraction gratings 45 and 46 such as shown in FIG. 8 and described with reference to the first embodiment. The diffraction gratings are formed along the X and Y axes. Since the diffraction gratings 45 and 46 are effective only for measurement with respect to one direction, the paired diffraction gratings for the measurement with respect to the X and Y directions are in a 90-degree rotated relation with each other.

In operation, the detection optical system 108 measures a relative positional deviation between a pair of reference diffraction gratings formed on the wafer 106 and having a predetermined mutual positional deviation, as those of the first embodiment, and measures a system error of the detection system as a whole.

Subsequently, it measures the relative positional deviation between a pair of diffraction gratings 45 and 45 of the same wafer 106. Thereafter, positional deviation measurements are made to the pairs of diffraction gratings of the whole wafer successively.

Figure 16:
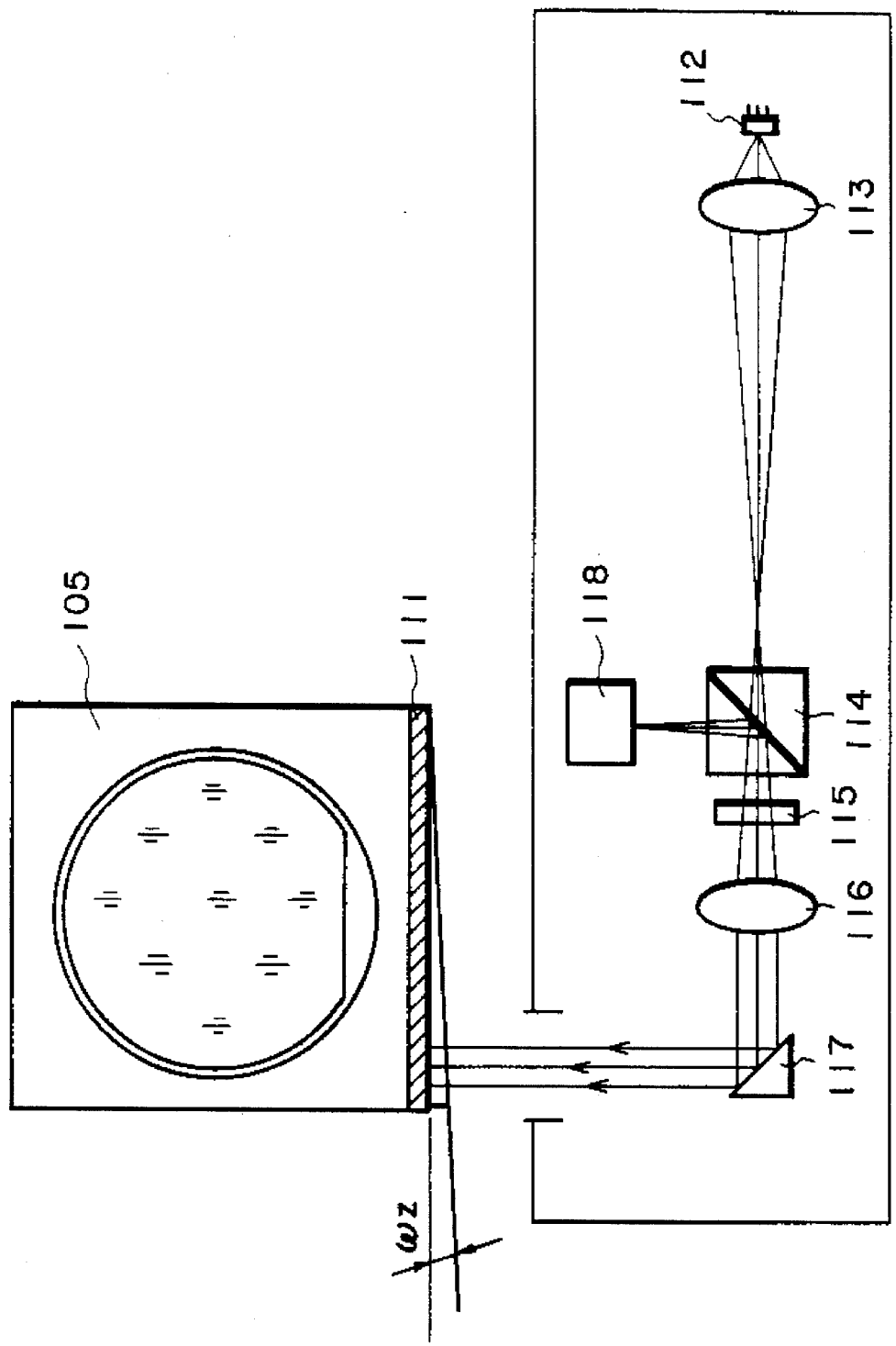
FIG. 16 is a schematic view of a detection optical system for detecting a yawing of an X-Y stage.

Now, the measurement for the amount of correction will be explained. In the second embodiment, a yawing detector 107 disposed on the base 101 operates to detect a yawing component produced during movement of the X stage 103 and the Y stage 104, by using a mirror 111 mounted on a side face of the θ stage 105. FIG. 16 shows the optical arrangement of the yawing detector 107.

Light of linear polarization (P-polarized light) produced by a light source 112 is collected at a focal point position of an objective lens 116. After this, the light goes through a polarization beam splitter 114 and then it is transformed by a quarter waveplate 115 into circularly polarized light which is projected on the objective lens 116. The light emerging from the objective lens 116 is parallel light which is then deflected by a mirror 117 toward the mirror 111 mounted on the θ stage 105. The light reflected by this mirror 111 is deflected again by the mirror 117, and then it is transformed by the quarter waveplate 115 into S-polarized light. This light is then reflectively deflected by a beam splitting surface of the polarization beam splitter 114, and the deflected light is projected on a beam position detector 118 (which will be referred to simply as "PSD 118"). The PSD 118 is disposed at a focal point position of the objective lens 116, such that the parallel light reflected by the mirror 111 is collected by the objective lens 116 upon the PSD 118.

A yawing component $w_z$ produced as a result of movement of the stage causes inclination of the mirror 111. The amount of this inclination can be detected as a beam displacement ε upon the PSD 118, in accordance with the principle of a collimator. Namely, the yawing component $w_z$ can be determined by:

$$w_z = \epsilon/2f \quad (17)$$

wherein f is the focal length of the objective lens 116. If f=100 mm and ε=1 micron, for example, then $w_z$=1 sec. Assuming that the yawing component during the measurement of the reference grating is zero, and if the distance d between the centers of the two diffraction gratings 1 and 2 of the wafer 106 is d=100 micron and a yawing $w_z$ of the stage of 1 sec=4.85 μrad is produced, then a measurement error corresponding to $2w_z \cdot d \approx 1$ nm is added to the measured value of registration error as detected by the measurement optical system 108. Namely, under the condition that the distance between the diffraction gratings is 100 microns, a rotation of the wafer 106 of 1 sec, along its surface, causes a measurement error of about 1 nm.

That is, even by the measurement of the relative deviation of the reference diffraction gratings and thus the measurement of the system error of the detection system as a whole, there remains a problem of a measurement error of about 1 nm resulting from a change in yawing component during movement of the stage from the reference diffraction grating to the diffraction grating to be examined.

In consideration of this, in this embodiment, a corrective calculation is made in the computer 110 on the basis of the output value ΔX from the phase difference detector 109, the system error $\epsilon_s$ obtainable through the measurement to the paired reference diffraction gratings, and an error $\epsilon_y$ resulting from the yawing component caused during the movement from the reference diffraction gratings to the paired diffraction gratings to be examined, which calculation is made in accordance with the following equation:

$$\Delta X_O = \Delta X - \epsilon_s - \epsilon_y \quad (18)$$

With this calculation, it becomes possible to determine a measurement value $\Delta X_O$ which does not contain a measurement error resulting from yawing of the stage or a system error of the detection system.

Figure 17:
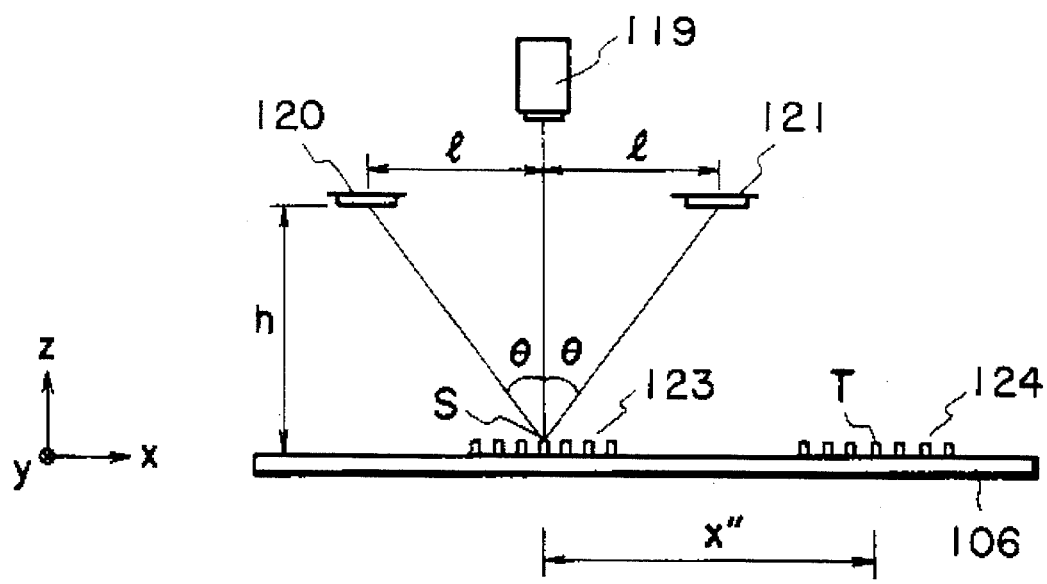
FIG. 17 is a schematic view of a rotation detection optical system, according to a third embodiment of the present invention, for detecting a rotation of a perpendicular incidence type diffraction grating.

FIG. 17 is a schematic view of a portion of a further embodiment of the present invention.

Light emitted by a light source 119 is projected on a portion around the center of one of two diffraction gratings which are juxtaposed on a wafer 106 and provided for relative position measurement. The light is perpendicularly projected to that diffraction grating, from the above. The range as illuminated by the light has a sufficient size for production of diffraction light by the illuminated diffraction grating. For example, it has a size similar to the size of each diffraction grating. Diffraction lights of ±n-th order produced by the illuminated diffraction grating are received by beam position detectors 120 and 121 (each of which will be referred to simply as "PSD 120" or "PSD 121"), whereby the beam positions of these diffraction lights are detected. The amount of yawing of the stage can be measured by comparing, with respect to each measuring point on the wafer, the beam positions of diffraction lights before and after the stage movement. The PSD 120 and PSD 121 each is disposed at a position of height h from the wafer 106 and a distance 1 (lateral) from the point S.

Figure 18:
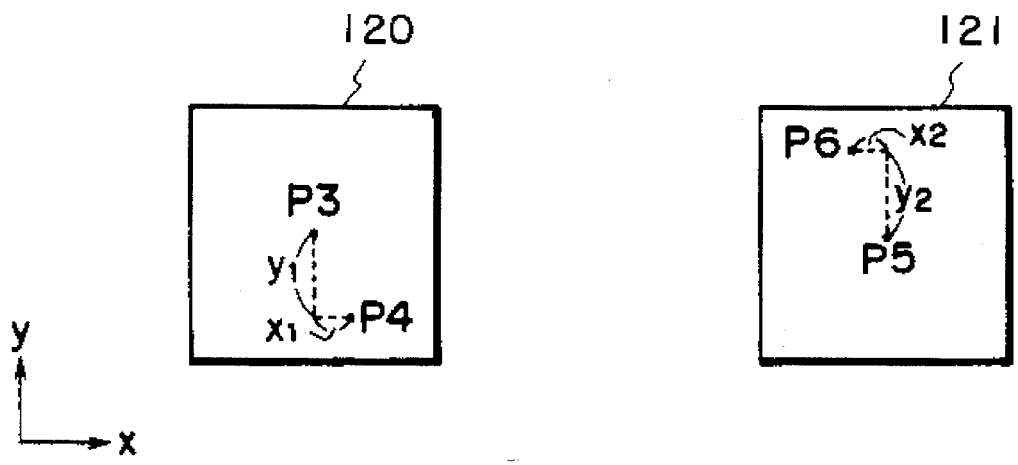
FIG. 18 is a schematic view, illustrating a light receiving surface of a beam detector.

Here, it is now assumed that two registration error measuring marks 123 and 124 are formed at different points on a wafer 106. Each measurement mark 123 or 124 comprises paired diffraction gratings 123a and 123b (124a and 124b). First, by using the measurement mark 123, a registration error measuring optical system 108 measures a registration error. Simultaneously with this, light is projected from the light source 119 onto the position about the center S of the measurement mark 123, and ±n-th order diffraction lights are received by the PSD 120 and PSD 121. FIG. 18 illustrates the light receiving surfaces of the PSD 120 and PSD 121. Denoted at P3 is the normal beam position of the positive n-th order diffraction light and denoted at P5 is that of the negative n-th order diffraction light. Namely, these points represent reference points. It is to be noted here that, with regard to the measurement mark 123, the ±n-th order diffraction lights are occasionally positioned at points P3 and P5.

After this, the stage is moved so as to shift the measuring position to the measurement mark 124 spaced by a distance x from the measurement mark 123. Then, with the measuring optical system 108, a registration error is measured similarly. If, during movement of the stage from the measurement mark 123 to the measurement mark 124, a yawing is produced and as a result the wafer is rotationally displaced by ρ along its surface, the positions of incidence of the ±n-th order diffraction lights impinging on the PSD 120 and PSD 121 displace correspondingly, from the position P3 to position P4 and from the position P5 to position P6. While the shift of position upon the PSD contains a component (such as pitching) that does not affect the measurement, such unnecessary component may be removed by calculation. Namely, by executing predetermined calculation on the basis of the relative position shift (x1, y1) between P3 and P4 and the relative position shift (x2, y2) between P5 and P6, it is possible to determine the quantity ρ of rotation of the wafer 106 along its surface which is the component that causes a measurement error. Thus, the calculated value is used and added to the measured value of registration error and, by this, high-precision measurement is assured. Further, by using the reference position of P3 and P5, it is possible to execute rotation correction of each wafer in terms of an absolute value.

In the manner described above, the registration error measuring optical system 108 measures a relative positional deviation between the diffraction gratings 123 and 124 of the wafer 106. As regards the measurement sequence, measurements are made first of the X-direction registration error measuring marks of the whole wafer and, after this, the wafer is rotated by 90 deg. Then, measurements are made of the Y-direction registration error measuring marks of the whole wafer. The order of measurement with respect to the X and Y directions may of course be reversed.

Figure 19:
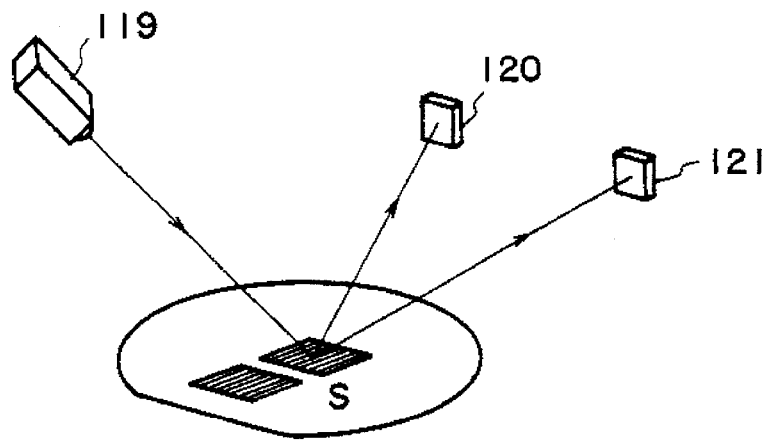
FIG. 19 is a schematic view of a rotation detection optical system, according to a fourth embodiment of the present invention, for detecting a rotation of an oblique incidence type diffraction grating.

FIG. 19 is a schematic view of a portion of a fourth embodiment of the present invention. Although in the third embodiment the light of the light source 119, for detection of yawing component, is projected on the wafer 106 perpendicularly from the above, it may be projected obliquely from the above as in the present embodiment while the detecting PSD 120 and PSD 121 may be disposed in the opposite side of the projected light and obliquely above thereof in accordance with the condition of light projection. Where the yawing detection optical system is disposed obliquely as described, there is an advantage of a larger latitude in respect to the disposition of the registration error measuring optical system 108.

Figure 20:
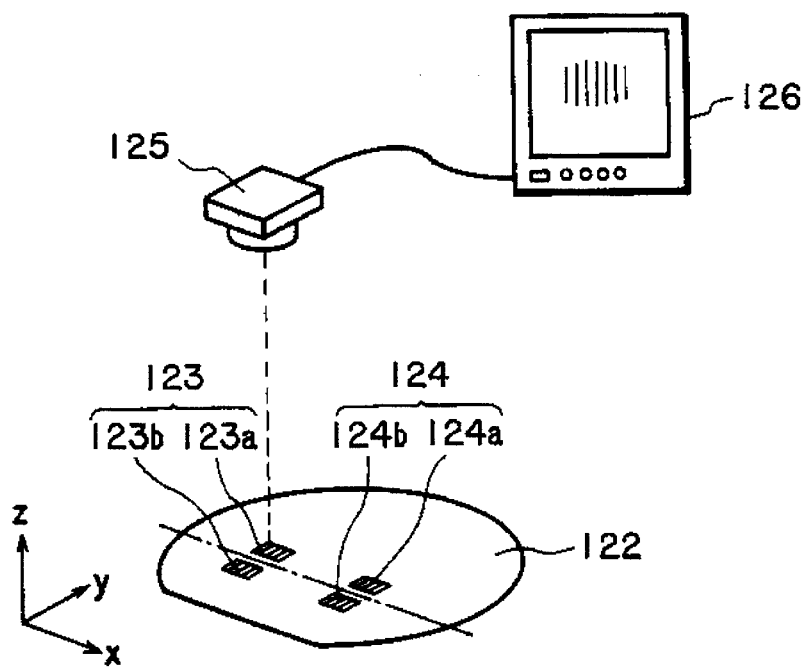
FIG. 20 is a schematic view of a rotation detection optical system according to a fifth embodiment of the present invention, which uses an image pickup device.
Figure 21:
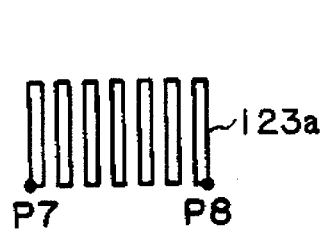
FIG. 21 schematically illustrates a diffraction grating pattern as can be observed on a CRT.
Figure 21:
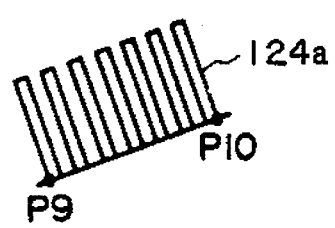

FIG. 20 is a schematic view of a portion of a fifth embodiment of the present invention. In this embodiment, rotation of a wafer along its surface is detected by using an image pickup device. In FIG. 20 embodiment, an imaging optical system, not shown, is used to form, on an image pickup device 125, an image of one of a pair of diffraction gratings 123a and 123b which constitute a grating 123, the image being displayed on a CRT 126. FIG. 21 is an enlarged view, wherein each of portions (A) and (B) thereof illustrate an image as displayed on the CRT 126. The measurement starts with detection, through image processing, of the coordinates of the lower left point P7 and of the lower right point P8 on the diffraction grating 123a, as illustrated in the portion (A) of FIG. 21. From the coordinates of these two points, the direction of a straight line connecting the two points is determined, and this represents the state of placement of the diffraction grating 123.

Similarly, for measurement of registration error of a diffraction grating 124 formed at a different measuring point on the wafer 106 which measurement is to be done after moving the wafer, one of a pair of diffraction gratings 124a and 124b (e.g. grating 124a) which constitute the diffraction grating 124 is imaged such as is illustrated in the portion (b) of FIG. 21. Then, the coordinates of the lower left point P9 and the lower right point P10 of the diffraction grating 124a are detected through image processing, whereby the direction of a straight line connecting these points is determined. Such an operation is repeated with respect to the remaining diffraction grating pairs formed on the wafer.

The direction of the straight line as determined with respect to each measurement point represents how the diffraction grating to be examined is being placed with respect to the measurement reference of the apparatus, namely, with respect to the registration error measuring optical system 108. It follows that any difference between the direction of the straight line as determined in relation to the diffraction grating 123a and that as determined in relation to the diffraction grating 124a, directly corresponds to the amount of rotation of the wafer along its surface caused during the movement from the diffraction grating 123 to the diffraction grating 124. Also, with the provision of a measurement reference axis within the image pickup device, it becomes possible to correct the absolute value of a measurement error resulting from rotation of a diffraction grating.

While the invention has been described with reference to the structures disclosed herein, it is not confined to the details set forth and this application is intended to cover such modifications or changes as may come within the purposes of the improvements or the scope of the following claims.

What is claimed is:

1. A device for measuring the relative positional deviation between first and second diffraction gratings formed on an object, said device comprising:

signal detecting means for detecting a signal corresponding to the relative positional deviation between the first and second diffraction gratings, said signal detecting means including (i) irradiating means for projecting first and second coherent light beams onto the first and second diffraction gratings, (ii) first photoelectric converting means for photoelectrically converting first interference light resulting from interference between first and second diffraction light beams both caused by diffraction of the first coherent light beam and the second coherent light beam by the first diffraction grating, (iii) second photoelectric converting means for photoelectrically converting second interference light resulting from interference between third and fourth diffraction light beams both caused by diffraction of the first and second coherent light beams by the second diffraction grating, and (iv) signal producing means for producing a signal corresponding to the relative positional deviation on the basis of output signals from said first and second photoelectric converting means, respectively;

moving means for relatively moving the object and at least a portion of said signal detecting means with respect to each other;

third and fourth diffraction gratings formed on said object;

error detecting means cooperable with said moving means to place third and fourth diffraction gratings of the object at a detecting position of said signal detecting means so that said signal detecting means produces a signal corresponding to a relative positional deviation between the third and fourth diffraction gratings, wherein said third and fourth diffraction gratings are formed on the object in a placement relationship the same as that of said first and second diffracting gratings, wherein said third and fourth diffraction gratings have a positional relationship which is predetermined with respect to the direction of positional deviation detection of said first and second diffraction gratings, and wherein said error detecting means detects an error in detection of a relative positional deviation by said signal detecting means on the basis of the signal produced by said signal detecting means in response to the detection of the predetermined relative positional deviation between the third and fourth diffraction gratings;

measuring means cooperable with said moving means to place the first and second diffraction gratings at the detecting position of said signal detecting means so that said signal detecting means produces a signal corresponding to the relative positional deviation between the first and second diffraction gratings, wherein said measuring means determines the relative positional deviation of the first and second diffraction gratings while correcting an error on the basis of the error detection by said error detecting means; and change detecting means for detecting a change in the amount of relative rotation of the object relative to said signal detecting means during relative movement of the object and said at least one portion of said signal detecting means, wherein, in determining the relative positional deviation, said measuring means corrects the error while adding the detected change in rotation amount to the error.

2. A device according to claim 1, wherein the first and second coherent light beams of said signal detecting means have different wavelengths.

3. A device according to claim 2, wherein said signal producing means includes means for producing a signal corresponding to a phase difference between the output signals of said first and second photoelectric converting means.

4. A device according to claim 1, wherein said moving means comprises a movable stage on which the object is placed, and wherein said change detecting means comprises yawing detecting means for detecting a yawing of said stage.

5. A device according to claim 1, wherein said change detecting means comprises projecting means for projecting light to a diffraction grating of the object, light directing means for directing ± n-th order light diffracted by the diffraction grating to a predetermined detection plane, and position detecting means for detecting a position of incidence of the ± n-th order light upon said detection plane.

6. A device according to claim 1, wherein said change detecting means comprises light projecting means for projecting light to a diffraction gratings of the object, and image projecting means for projecting an image of the diffraction grating upon a predetermined detection plane.

7. A method of measuring the relative positional deviation between first and second diffraction gratings formed on an object, said method comprising the steps of:

detecting, through a signal detecting system, a signal corresponding to the relative positional deviation between the first and second diffraction gratings, wherein the signal detecting system including (i) an optical system for projecting first and second coherent light beams onto the first and second diffraction gratings, (ii) a first photoelectric converting device for photoelectrically converting first interference light resulting from interference between first and second diffraction light beams both caused by diffraction of the first coherent light beam and the second coherent light beam by the first diffraction grating, (iii) a second photoelectric converting device for photoelectrically converting second interference light resulting from interference between third and fourth diffraction light beams both caused by diffraction of the first and second coherent light beams by the second diffraction grating, and (iv) a signal producing unit for producing a signal corresponding to the relative positional deviation on the basis of output signals from the first and second photoelectric converting devices, respectively;

providing third and fourth diffraction gratings formed on said object;

detecting an error in detection of the relative positional deviation by the signal detecting systems, wherein, for said error detection, third and forth diffraction gratings of the object are placed at a detecting position of the signal detecting system so that the signal detecting system produces a signal corresponding to the relative positional deviation between the third and fourth diffraction gratings, wherein said third and fourth diffraction gratings are formed on the object in a placement relationship the same as that of said first and second diffraction gratings, and wherein said third and fourth diffraction gratings have a positional relationship which is predetermined with respect to the direction of positional deviation detection of said first and second diffraction gratings, and wherein the error in detection of a relative positional deviation by the signal detecting system is detected on the basis of the signal produced by the signal detecting system in response to the detection of the predetermined relative positional deviation between the third and fourth diffraction gratings;

measuring the relative positional deviation of the first and second diffraction gratings, wherein, for said measurement, the first and second diffraction gratings are placed at the detecting position of the signal detecting system so that the signal detecting system produces a signal corresponding to the relative positional deviation between the first and second diffraction gratings, and wherein the relative positional deviation of the first and second diffraction gratings is determined while correcting an error on the basis of said error detection; and relatively moving the object and at least a portion of the signal detecting system, and detecting a change in amount of relative rotation of the object relative to the signal detecting system during said relative movement, wherein, in said measurement, the error is corrected while the change in rotation amount is added to the error.

* * * * *

UNITED STATES PATENT AND TRADEMARK OFFICE
CERTIFICATE OF CORRECTION

PATENT NO. : 5,585,923
DATED : December 17, 1996
INVENTOR(S) : NORIYUKI NOSE, ET AL.

It is certified that error appears in the above-indentified patent and that said Letters Patent is hereby corrected as shown below:

ON THE COVER PAGE:

Item [30] Foreign Application Priority Data:

"Sep. 27, 1993 [JP] Japan....4-264248"

should read

--Sep. 27, 1993 [JP] Japan....5-264148--.

COLUMN 1:

Line 47, "is" should be deleted.

UNITED STATES PATENT AND TRADEMARK OFFICE
CERTIFICATE OF CORRECTION

PATENT NO. : 5,585,923
DATED : December 17, 1996
INVENTOR(S) : NORIYUKI NOSE, ET AL.

It is certified that error appears in the above-indentified patent and that said Letters Patent is hereby corrected as shown below:

COLUMN 2:

Line 39, "where a wafer" should read --where the wafer--.

COLUMN 4:

Line 49, "gratings the" should read --gratings. The--.

Line 67, "a" should be deleted and "an" should read --the--.

UNITED STATES PATENT AND TRADEMARK OFFICE
CERTIFICATE OF CORRECTION

PATENT NO. : 5,585,923
DATED : December 17, 1996
INVENTOR(S) : NORIYUKI NOSE, ET AL.

It is certified that error appears in the above-indentified patent and that said Letters Patent is hereby corrected as shown below:

COLUMN 5:

Line 2, "a" should be deleted.

Line 3, "of a" should read --of the--.

Line 16, "a light" should read --light--.

COLUMN 8:

Line 27, "as and" should read --and--.

COLUMN 10:

Line 60, "a" should be deleted.

UNITED STATES PATENT AND TRADEMARK OFFICE
CERTIFICATE OF CORRECTION

PATENT NO. : 5,585,923
DATED : December 17, 1996
INVENTOR(S) : NORIYUKI NOSE, ET AL.

It is certified that error appears in the above-indentified patent and that said Letters Patent is hereby corrected as shown below:

COLUMN 14:

Line 67, "gratings" should read --grating--.

COLUMN 15:

Line 31, "forth" should read --fourth--.

Signed and Sealed this

Twentieth Day of May, 1997

Attest:

BRUCE LEHMAN

Attesting Officer      Commissioner of Patents and Trademarks